US007795996B2

(12) United States Patent
Choi et al.

(10) Patent No.: US 7,795,996 B2
(45) Date of Patent: Sep. 14, 2010

(54) MULTILAYERED COPLANAR WAVEGUIDE FILTER UNIT AND METHOD OF MANUFACTURING THE SAME

(75) Inventors: Sung-tae Choi, Gyeonggi-do (KR); Jung-han Choi, Gyeonggi-do (KR); Cheol-gyu Hwang, Gyeonggi-do (KR); Young-hwan Kim, Gyeonggi-do (KR); Dong-hyun Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 168 days.

(21) Appl. No.: 12/045,101

(22) Filed: Mar. 10, 2008

(65) Prior Publication Data

US 2009/0121811 A1 May 14, 2009

(30) Foreign Application Priority Data

Nov. 12, 2007 (KR) ..................... 10-2007-0115121

(51) Int. Cl.
*H03H 7/01* (2006.01)

(52) U.S. Cl. ...................................... 333/185; 333/246

(58) Field of Classification Search ................. 333/236, 333/238, 246, 245, 204, 185
See application file for complete search history.

(56) References Cited

U.S. PATENT DOCUMENTS 6,606,017 B1 8/2003 Xu et al.
7,190,244 B2 * 3/2007 Hettak ........................ 333/263

FOREIGN PATENT DOCUMENTS

| | | |
|---|---|---|
| JP | 11-220304 | 8/1999 |
| JP | 2002-026611 | 1/2002 |
| JP | 2002-290117 | 10/2002 |
| KP | 2001-0104830 | 11/2001 |
| KP | 2004-0071916 | 8/2004 |
| KP | 2005-0043554 | 5/2005 |

* cited by examiner

*Primary Examiner*—Stephen E Jones
(74) *Attorney, Agent, or Firm*—NSIP Law

(57) ABSTRACT

A multilayered coplanar waveguide (CPW) filter unit and a method of manufacturing the same are provided. A plate having a capacitance element is formed on or below a CPW layer including a signal line for transmitting a signal and a ground plane. As the filter unit has a multilayered structure, characteristic impedance may be reduced without increasing the width of the signal line. Where an inductor line is inserted between the signal line and the plate, a clear frequency response curve may be obtained without performing an additional process or increasing the area of the filter unit.

17 Claims, 7 Drawing Sheets

MULTILAYERED COPLANAR WAVEGUIDE FILTER UNIT AND METHOD OF MANUFACTURING THE SAME

CROSS REFERENCE TO RELATED APPLICATIONS

This application claims the benefit under 35 U.S.C. §119(a) of a Korean Patent Application No. 10-2007-0115121, filed on Nov. 12, 2007, the disclosure of which is incorporated herein in its entirety by reference.

TECHNICAL FIELD

The following description relates to a filter unit, and more particularly, to a multilayered coplanar waveguide (CPW) filter unit for use in a high frequency band and a method of manufacturing the same.

BACKGROUND

Generally, a filter refers to a system that performs a specific operation in response to an input signal and generates an output signal based on the operation result. More specifically, the filter may refer to a circuit designed to remove an undesired portion of a frequency spectrum so as to obtain a desired transmission characteristic.

Typical filters, which are widely used in the field of communications, include low-pass filters (LPFs) that allow only low-frequency signals to pass therethrough, high-pass filters (HPFs) that allow only high-frequency signals to pass therethrough, and bandstop filters (BSFs) that cut off signals in a specific frequency band.

Such a filter is manufactured by appropriately combining passive devices, such as a resistor (R), an inductor (L), and a capacitor (C), and frequency characteristics of the filter are dependent on the circuital arrangement and device characteristics of the combined passive devices.

In recent years, communication systems using increasingly higher frequencies (e.g., microwaves and millimeter waves) have been introduced in order to utilize conventional deficient communication channels more efficiently. In particular, when a communication system uses an ultrahigh frequency, such as microwaves and millimeter waves, the communication system can be scaled down. Therefore, owing to the increased demand for miniaturization, communication systems using ultrahigh frequency bands have become strongly relied upon.

However, a conventional filter in which passive devices, such as a resistor (R), an inductor (L), and a capacitor (C), are mounted on a printed circuit board (PCB) may not be applied to ultra-high frequency communication systems. This is due to the fact that a high frequency leads to a short wavelength which thereby worsens interference between communication lines so that each of the communication lines operates as a circuit device. In other words, since unpredictable elements are increased in ultra-high frequency bands, there is a specific technical limit for employing typical passive devices in the ultra-high frequency bands.

Therefore, a vast amount of research has been conducted on developing passive devices applicable in ultra-high frequency bands, such as microwaves and millimeter waves. For example, conventional methods have been used in an attempt to embody two-dimensional lumped elements so as to predict parasitic elements in high-frequency bands.

However, conventional ultra-high frequency pass filters cause high signal loss in the pass band and frequently allow frequencies other than target frequencies, particularly, spurious harmonic frequencies, to pass therethrough. To address the above-described problems and improve the characteristics of filters, it may be desirable to reduce characteristic impedances. However, since the size of a filter must be increased to reduce the characteristic impedance, it is difficult to embody filters that are usable in ultra-high frequency bands and have good frequency characteristics.

SUMMARY

Accordingly, in one general aspect, there is provided a multilayered coplanar waveguide (CPW) filter unit, which is usable in an ultra-high frequency band, small-sized, causes low signal loss in the pass band, and has good bandstop characteristics, and a method of manufacturing the filter unit.

In another aspect, there is provided a filter unit having a multilayered CPW structure by forming a plate above or below a layer including a signal line and a ground plane and increasing a capacitance using a small-sized plate.

In still another aspect, a multilayered CPW filter unit includes a signal line for transmitting a signal, ground planes disposed on both sides of the signal line, at least one plate disposed opposite each of the ground planes to form a capacitance element, a via extending upward or downward from the signal line, and an inductor line having a first end connected to the plate and a second end connected to the via to form an inductance element.

The plate may include an upper plate disposed above the ground plane and a lower plate disposed below the ground plane. The upper and lower plates may be connected to each other by a connection portion that penetrates between the signal line and the ground plane.

The plate may have a square shape, a ⊂ shape, or a square ring shape. Each side of the plate may have a smaller length than the signal line having high impedance.

The inductor line may be formed at the same layer as the plate. Also, the inductor line may have a straight shape or a spiral shape.

The signal line may be a meander line.

The signal line, the via, the plate, and the inductor line may be formed of a metal with the same characteristics and electrically connected to one another.

A plurality of filter units may be repeatedly arranged in a lengthwise direction of the signal line. In this case, the filter unit may be used as a low pass filter (LPF) or a bandstop filter (BSF).

The frequency characteristics of the filter unit may depend on the length of the signal line, the number and size of the plates, or the length of the inductor line.

In yet another aspect, a method of manufacturing a multilayered CPW filter unit, includes forming a first layer including a signal line for transmitting a signal and ground planes disposed apart from both sides of the signal line, forming a via extending upward or downward from the signal line, and forming a second layer including at least one plate disposed opposite to each of the ground planes and an inductor line having a first end connected to the plate and a second end connected to the via.

Each of the first and second layers may be formed using a complementary metal oxide semiconductor (CMOS) process, a multilayered printed circuit board (PCB) process, a low-temperature cofired ceramic (LTCC) process, or a high-temperature cofired ceramic (HTCC) process.

Other features will become apparent to those skilled in the art from the following detailed description, which, taken in conjunction with the attached drawings, discloses exemplary embodiments of the invention.

BRIEF DESCRIPTION OF THE DRAWINGS

Throughout the drawings and the detailed description, the same drawing reference numerals will be understood to refer to the same elements, features, and structures.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness.

Figure 1:
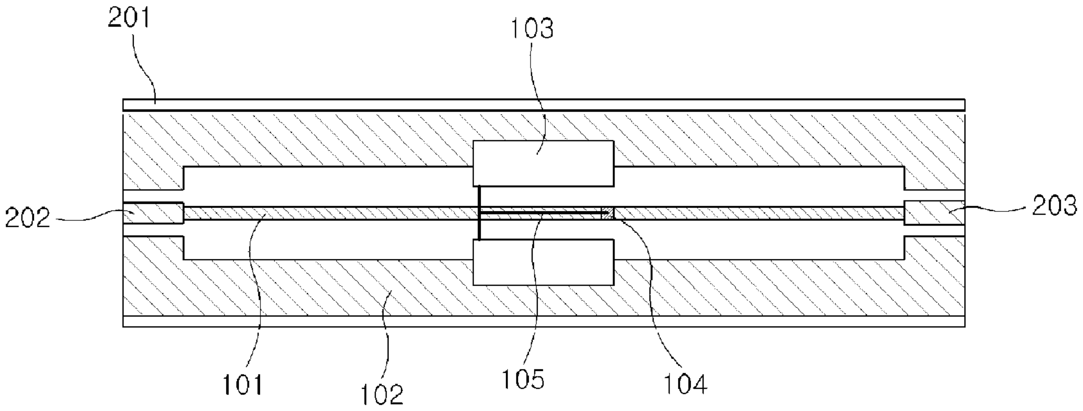
FIG. 1 is a plan view of a multilayered coplanar waveguide (CPW) filter unit according to an exemplary embodiment.

FIG. 1 is a plan view of a multilayered coplanar waveguide (CPW) filter unit according to an exemplary embodiment.

Figure 4:
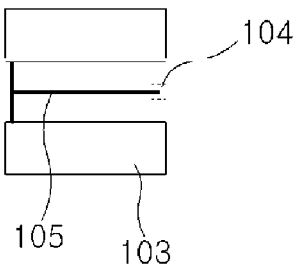
FIG. 4 is a plan view of a second layer of the filter unit shown in FIG. 1.

Referring to FIG. 1, the CPW filter unit includes a signal line 101, a ground plane 102, a plate 103, a via 104, and an inductor line 105. Also, the CPW filter unit has a multilayered structure. That is, the signal line 101 and the ground plane 102 form a first layer, and the plate 103 and the inductor line 105 form a second layer, so that the first layer is connected to the second layer by the via 104. The first and second layers are illustrated in FIGS. 2 and 4, respectively.

The first and second layers are only concepts for three-dimensionally explaining the filter unit according to the current embodiment and thus, components of each of the first and second layers may not necessarily be disposed at the same plane. Thus, it can be inferred that components disposed at different layers are not located at the same plane. Furthermore, the second layer may be located below the first layer.

Figure 2:
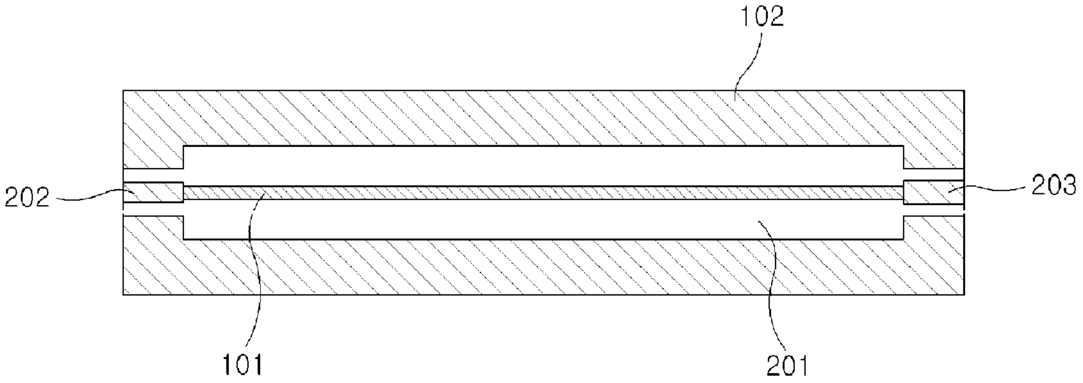
FIG. 2 is a plan view of a first layer of the filter unit shown in FIG. 1.

In FIGS. 1 and 2, the signal line 101, which is disposed on a substrate 201 and corresponds to a high-impedance line, transmits a signal input via an input terminal 202 to an output terminal 203. Also, the signal line 101 constitutes an inductance element of the filter unit.

The transmitted signal may be an electrical signal having an arbitrary frequency, particularly, an ultra-high frequency signal, such as a microwave signal or a millimeterwave signal. Thus, the input and output terminals 202 and 203, the signal line 101, the ground plane 102, the plate 103, the via 104, and the inductor line 105 may be formed of metals, for example, aluminum (Al), copper (Cu), and gold (Au), which may receive and transmit electrical signals.

The ground planes 102 are formed on both sides of the signal line 101 so as to ground the entire structure (or the entire circuit).

In this case, the signal line 101 and the ground plane 102 may use a coplanar waveguide (CPW) structure formed on the substrate 201.

Figure 3:
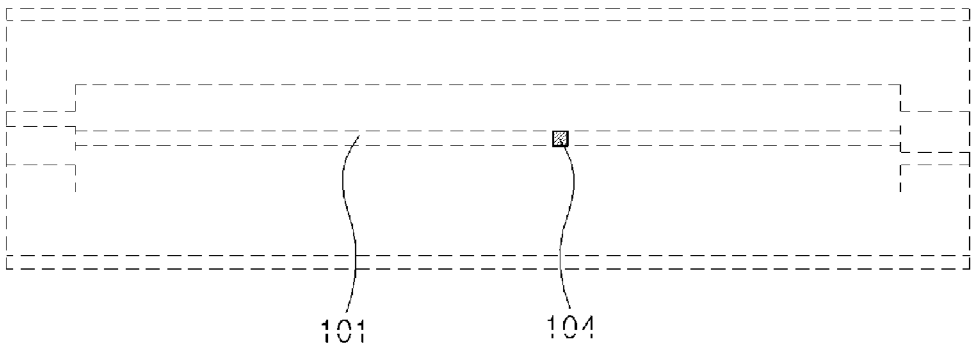
FIG. 3 is a plan view of a via of the filter unit shown in FIG. 1.

Referring to FIGS. 1 and 3, the via 104 extends upward from the signal line 101 and structurally connects the foregoing first and second layers. Thus, a direction in which the via 104 extends from the signal line 101 depends on a position of the second layer formed by the plate 103 and the inductor line 105. Therefore, it is also possible that the via 104 may extend downward from the signal line 101.

Also, the via 104 electrically connects the first and second layers. Specifically, the via 104 is formed of the same material as the signal line 101 and allows a signal passing through the signal line 101 to branch into the via 104. The signal applied to the via 104 is transmitted through the inductor line 105 to the plate 103.

Referring to FIGS. 1 and 4, the plate 103 is disposed a predetermined distance apart from the ground plane 102 above the ground plane 102. The plate 103 may be a metal plate which is formed of the same material as the ground plane 102 and disposed opposite to the ground plane 102 to form a capacitance. Also, since the ground planes 102 are respectively formed on both sides of the signal line 101, the plates 103 may be respectively formed above and below the two ground planes 102.

Figure 5:
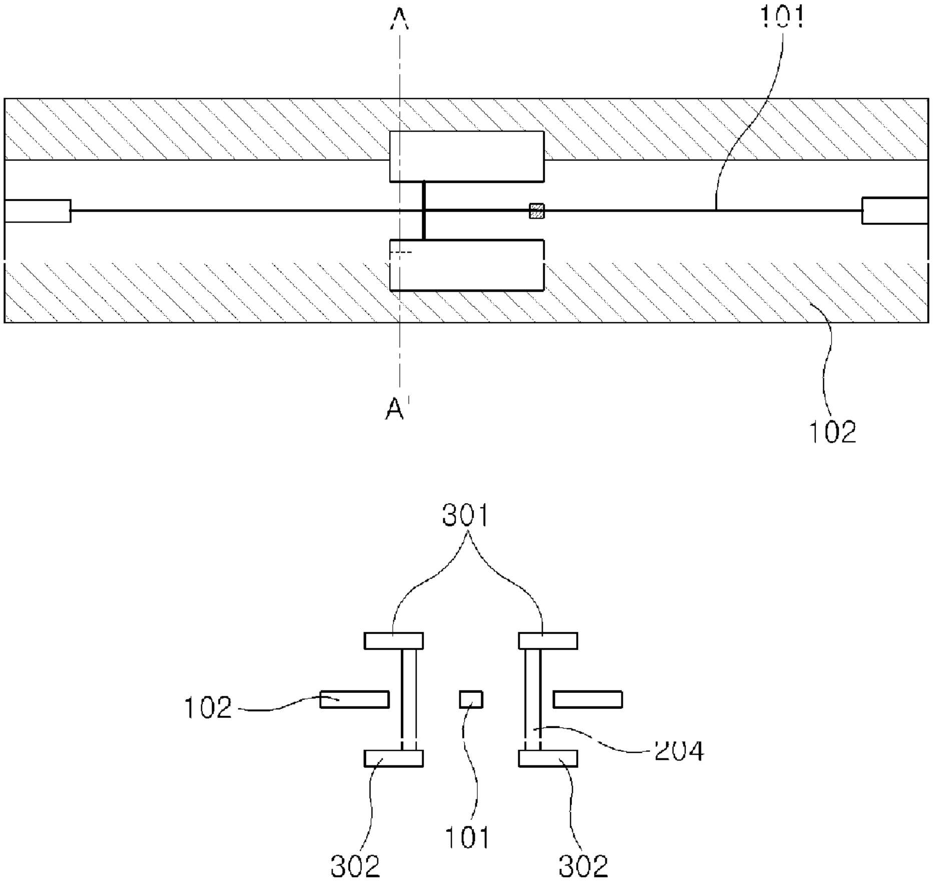
FIG. 5 is a cross-sectional view of upper and lower plates according to an exemplary embodiment.

FIG. 5 is a cross-sectional view of a portion of a filter unit according to an exemplary embodiment, wherein plates are respectively formed above and below a ground plane.

In FIG. 5, a pair of plates 301 are formed above the ground plane 102, and a pair of plates 302 are formed below the ground plane 102. In this case, the upper plates 301 are respectively connected to the lower plates 302 by connection portions 204 that penetrate between the signal line 101 and the ground planes 102.

Figure 7:
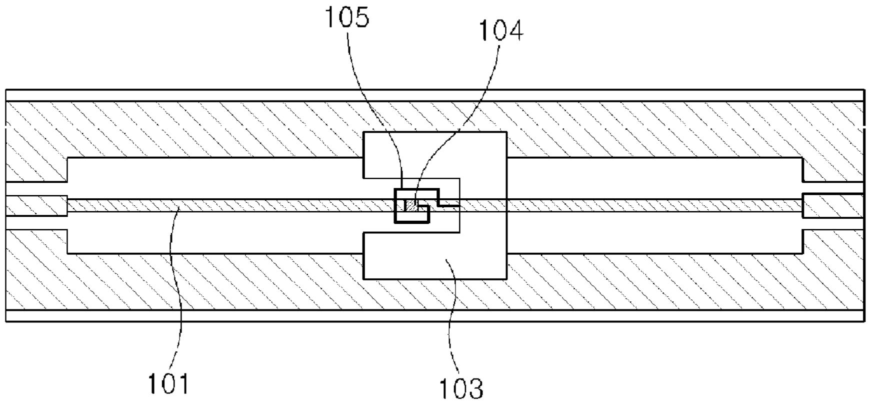
FIG. 7 is a plan view of a filter unit according to an exemplary embodiment.

However, the number of the plates 103 is not limited to the above description, and at least a portion of the plate 103 may be opposite to the ground plane 102 to function as a capacitor. For example, it is obvious that two plates 103 formed above or below the ground plane 102 may be connected in the shape of ⊂ or a square ring. FIG. 7 illustrates an example of a ⊂-shaped plate, which will be described later.

Referring again to FIG. 1, the inductor line 105 is disposed a predetermined distance apart from the signal line 101 above the signal line 101 similar to the plate 103 disposed apart from the ground plane 102 above the ground plane 102. The inductor line 105 may be formed at the same layer as the plate 103, but it is not limited thereto. The inductor line 105 may be formed of the same metal as the signal line 101 to allow a signal to pass therethrough. Also, the inductor line 105 connects the plate 103 to the via 104. That is, a first end of the inductor line 105 is connected to the via 104, and a second end of the inductor line 105 is connected to the plate 103 to form an inductance element.

Also, the inductor line 105 may have a straight or spiral shape so as to connect the plate 103 to the via 104. For example, FIG. 7 exemplarily illustrates a spiral-shaped inductor line 105 as will be described later.

Figure 6:
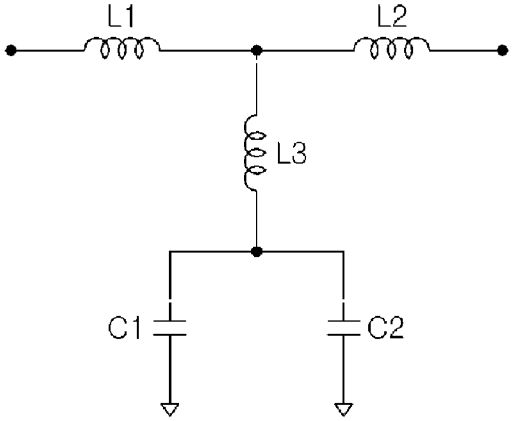
FIG. 6 is an equivalent circuit diagram of the filter unit shown in FIG. 1.

FIG. 6 is an equivalent circuit diagram of the filter unit shown in FIG. 1. Hereinafter, the operating principle of the filter unit shown in FIG. 1 will be described with reference to FIG. 6.

Referring to FIG. 6, a first inductor L1 and a second inductor L2, which are connected in series, correspond to the signal line 101, and a third inductor L3 branched from the first and second inductors L1 and L2 corresponds to the inductor line 105. In this case, a branch point between the first and second inductors L1 and L2 is determined by the via 104. Also, first and second capacitors C1 and C2, which are connected in series to the inductor line 105, correspond to the plate 103. When plates are respectively formed above and below the ground plane 102 as shown in FIG. 5, four parallel capacitors may be connected to the third inductor L3.

It would be apparent to one of ordinary skill that the above-described equivalent circuit may be used as a low-pass filter (LPF) or a bandstop filter (BSF) and thus, a detailed description of the equivalent circuit will be omitted and only a simple description thereof will be presented. While a signal input to the input terminal 202 passes through the signal line 101 (i.e., the first and second inductors L1 and L2), a high-frequency element is removed from the signal. Even the remaining high-frequency element is input to the plate 103 (i.e., the first and second capacitors C1 and C2) along the inductor line 105 (i.e., the third inductor L3) and removed.

As described above, the filter unit must have a very small characteristic impedance to have a good bandstop characteristic. In order to reduce the characteristic impedance, a capacitance value must be increased. However, in this case, the width of a CPW line is increased to thereby increase the size of the entire filter unit.

However, in the filter unit according to the exemplary embodiment, since the plate 103 having a capacitance element and the ground plane 102 are formed at different layers and connected in parallel, the width of the CPW line is not increased and the capacitance can be increased. Also, the small inductor L3 is provided at front ends of the capacitors C1 and C2 so that the frequency characteristics of the filter unit can be controlled more efficiently using additional series resonance.

Furthermore, when the high-impedance signal line 101 is formed to wind, the filter unit can be further scaled down.

FIG. 7 is a plan view of a multilayered CPW filter unit according to an exemplary embodiment.

Referring to FIG. 7, a plate 103 is formed in a ⊂ shape by connecting two metal plates disposed opposite to ground planes 102 on both sides of a signal line 101. Since a capacitance is provided between the plate 103 and the opposite ground planes 102, even if the two metal plates disposed above the ground planes 102 are connected to each other to form the ⊂-shaped plate 103, the frequency characteristics of the filter unit are unaffected.

Although not shown in the drawings, it is also possible that two metal plates may be connected to form a square-ring-type plate 103.

The shape of the plate 103 may be variously changed according to the purpose or design of the filter unit, and the number of the plates 103 may be also controlled. For example, a plate (not shown) having a square shape, a ⊂ shape, or a square ring shape may be further prepared below the ground line 102 and connected to the plate 103 by the connection portion (refer to 204 in FIG. 5).

Moreover, the shape of the inductor line 105 may be variously changed as described above. FIG. 7 exemplarily illustrates the inductor line 105 having a spiral shape.

Figure 8:
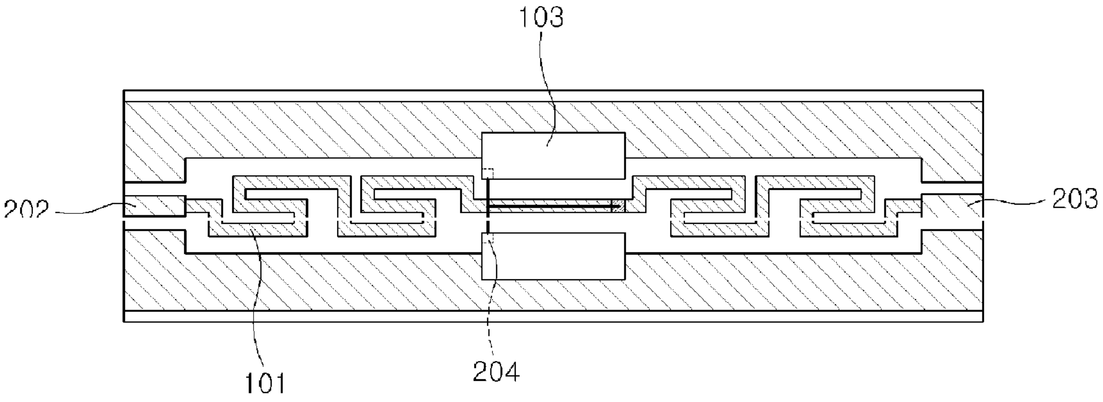
FIG. 8 is a plan view of a filter unit according to another embodiment.

FIG. 8 is a plan view of a multilayered CPW filter unit according to another exemplary embodiment, wherein a signal line is formed to wind.

Referring to FIG. 8, a signal line 101 is formed to be a meander line. When the signal line 101 is a meander line, the size of the filter unit can be further reduced.

A pair of upper plates 103 are formed above a ground plane 102, and another pair of lower plates 103 are formed below the ground plane 102. The upper and lower plates 103 are connected by vias 204, respectively.

Each of the plates 103 may have a length of about 100 μm and a width of about 17 μm, and the entire filter unit may be formed to a length of about 400 μm or less and a width of about 120 μU or less. In this case, the sizes of the filter unit and the plate 103 depend on desired frequency response characteristics.

Figure 9:
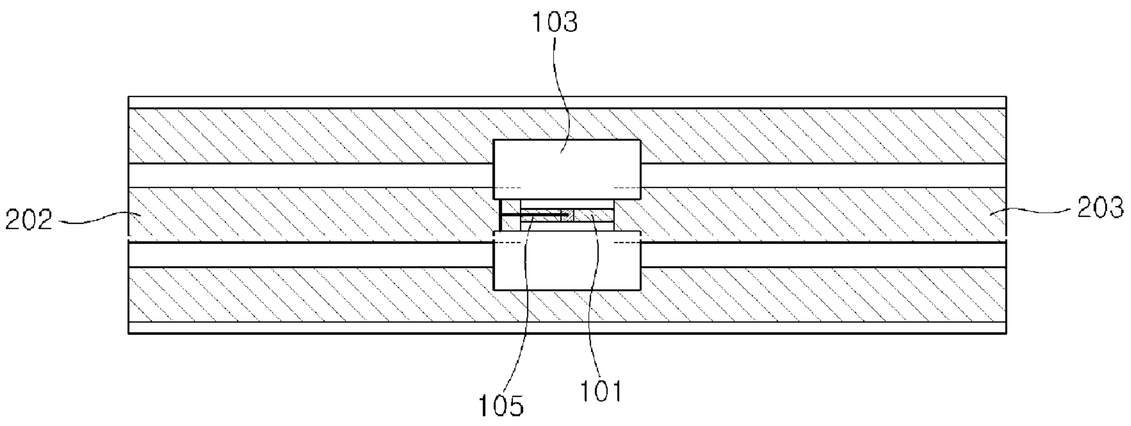
FIG. 9 is a plan view of a filter unit according to another embodiment.

FIG. 9 is a plan view of a multilayered CPW filter unit according to yet another exemplary embodiment, wherein the frequency characteristics of the filter unit are controlled according to the length of a signal line.

Referring to FIG. 9, it can be seen that the length of a signal line 101 is shorter than in the above-described embodiments. Specifically, an input terminal 202 and an output terminal 203 located on both ends of the signal line 101 extend to lower portions of plates 103, and the signal line 101 is provided to the minimum length below the plates 103.

When the signal line 101 has the minimum length, an inductance element of the signal line 101 is negligible in comparison with a capacitance element of the plate 103, and the filter unit according to the exemplary embodiment may be used as a bandstop filter (BSF) using the series resonance of the plate 103 and the signal line 101.

In the embodiment(s) disclosed herein, it is exemplarily described that the frequency characteristics of the filter unit may be controlled according to the length of the signal line 101. Therefore, the disclosed embodiments and teachings are not limited to a case where the signal line 101 has a smaller length than that of the plate 103, and the signal line 101 may have a length equal to or longer than that of the plate 103.

As when the filter unit is used as an LPF, the shape of an inductor line 105 and the number and shape of the plates 103 may be controlled.

The filter unit according to an embodiment may be utilized as a single unit of the entire filter structure. For example, the filter unit may be repetitively arranged in a lengthwise direction of the signal line 101. Also, the frequency characteristics of each filter unit may be controlled by appropriately determining the length of the signal line 101, the number and size of the plates 103, and the length of the inductor line 105. Thus, each filter unit may be used as an LPF or a BSF depending on the controlled frequency characteristics.

Hereinafter, a method of manufacturing a multilayered CPW filter unit according to an exemplary embodiment will be described with reference to FIGS. 10A through 10E.

Since the filter unit according to an embodiment has a multilayered structure and a very small size as described above, it is possible to manufacture the filter unit using a complementary metal oxide semiconductor (CMOS) technique in which a predetermined metal layer is deposited on a substrate and etched to form components of each layer. A description of a typical CMOS process will be omitted here.

Figure 10A:
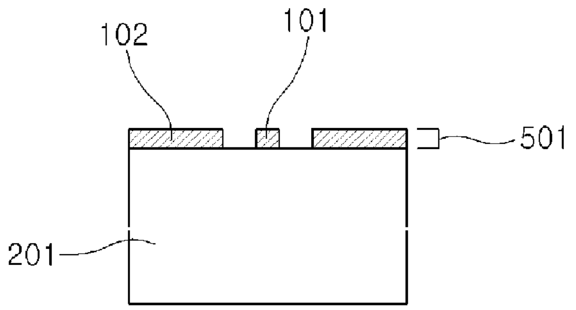
FIGS. 10A through 10E illustrate a method of manufacturing a filter unit according to an exemplary embodiment.

Referring to FIG. 10A, a first metal layer 501 is deposited on a substrate 201 and etched, thereby forming a first layer including a signal line 101 and ground planes 102.

Figure 10B:
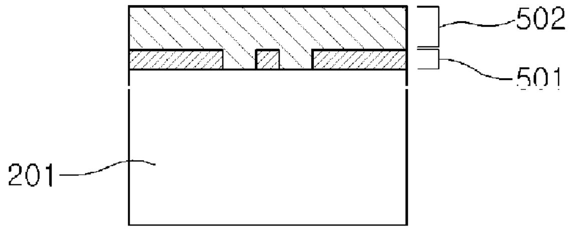
Figure 10C:
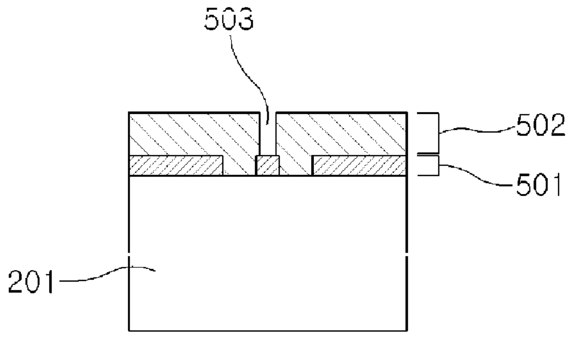

Referring to FIGS. 10B and 10C, an oxide layer 502 is coated on the first layer and etched, thereby forming a via hole 503 on the signal line 101. The via hole 503 is a space where a via 104 for connecting the first layer and a second layer will be formed.

Figure 10D:
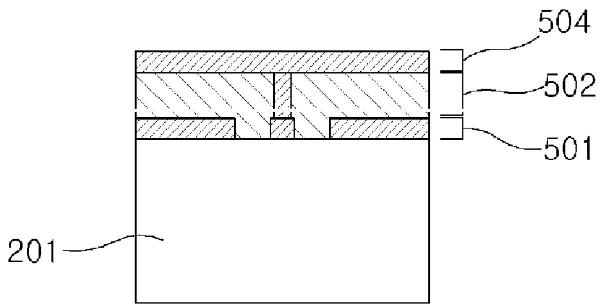

Referring to FIG. 10D, a second metal layer 504 is deposited on the via hole 503 and the oxide layer 502.

Figure 10E:
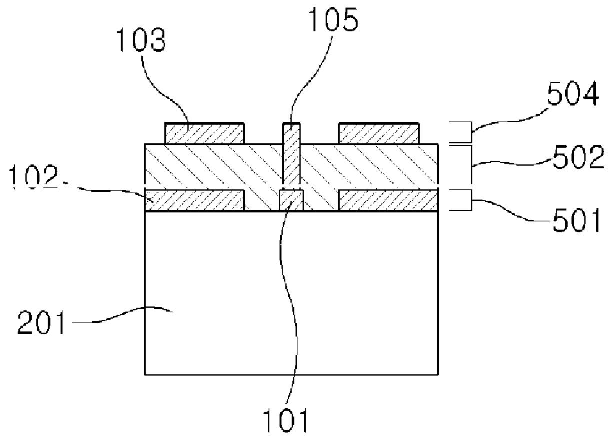

Referring to FIG. 10E, the second metal layer 504 is etched, thereby forming a second layer including a plate 103 and an inductor line 105. In this case, the shapes of the plate 103 and the inductor line 105 may be variously changed as described above. Accordingly, the second metal layer 504 may be etched using a mask that is variously patterned according to its purpose.

The first and second metal layers 501 and 504 may be formed of the same material, such as aluminum (Al), copper (Cu), or gold (Au), so that they can be electrically connected to each other and receive and transmit signals from and to each other, and components formed at each of the first and second layers may be integrally formed. Also, the first and second layers may be formed in the reverse order. Specifically, the second layer including the plate 103 and the inductor line 105 may be formed beforehand, and the via 104 and the first layer including the signal line 101 and the ground plane 102 may be stacked thereon. Furthermore, upper and lower plates 103 may be formed on and below the first layer and connected to each other by a connection portion 204.

In addition to the foregoing CMOS process, each of the first and second layers may be formed using a multilayered substrate process, such as a multilayered printed circuit board (PCB) process, a low-temperature cofired ceramic (LTCC) process, or a high-temperature cofired ceramic (HTCC) process.

As apparent from the above description, a filter unit may have a multilayered structure by forming a plate constituting a capacitance element above or below a layer including a signal line and a ground plane, so that characteristic impedance may be reduced without increasing the width of the signal line. Therefore, the filter unit according to an exemplary embodiment may be used as a small-sized ultra-high frequency filter having good frequency characteristics.

According to an aspect, since the plate and the ground plane are connected in parallel, even if the size of the plate is reduced, the filter unit may maintain a high capacitance value. According to another aspect, an inductor line is inserted between the signal line and the plate, so that a frequency response curve may be improved without performing an additional process or increasing the area of the filter unit.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A multilayered coplanar waveguide (CPW) filter unit, comprising:

a signal line for transmitting a signal;

ground planes disposed on both sides of the signal line;

at least one plate disposed opposite to each of the ground planes to form a capacitance element;

a via extending upward or downward from the signal line; and an inductor line having a first end connected to the plate and a second end connected to the via to form an inductance element.

2. The filter unit of claim 1, wherein the plate comprises:

an upper plate disposed above the ground plane; and a lower plate disposed below the ground plane, wherein the upper and lower plates are connected to each other by a connection portion that penetrates between the signal line and the ground plane.

3. The filter unit of claim 1, wherein the plate has a square shape, a ⊂ shape, or a square ring shape.

4. The filter unit of claim 1, wherein each side of the plate has a smaller length than the signal line.

5. The filter unit of claim 1, wherein the inductor line is formed at the same layer as the plate.

6. The filter unit of claim 1, wherein the inductor line has a straight shape or a spiral shape.

7. The filter unit of claim 1, wherein the signal line is a meander line.

8. The filter unit of claim 1, wherein the signal line has a length equal to or smaller than that of the plate.

9. The filter unit of claim 1, wherein the signal line is disposed only below the plate.

10. The filter unit of claim 1, wherein the signal line, the via, the plate, and the inductor line are formed of a metal with the same characteristics and electrically connected to one another.

11. The filter unit of claim 1, which is equivalent to a circuit comprising first and second inductors connected in series, a third inductor branched between the first and second inductors and connected in parallel to the first and second inductors, and a plurality of parallel capacitors connected in series to the branched third inductor.

12. The filter unit of claim 1, which is repeatedly arranged in a lengthwise direction of the signal line.

13. The filter unit of claim 1, wherein the filter unit is used as a low pass filter (LPF) or a bandstop filter (BSF).

14. The filter unit of claim 1, wherein frequency characteristics of the filter unit depend on the length of the signal line, the number and size of the plates, or the length of the inductor line.

15. A method of manufacturing a multilayered coplanar waveguide (CPW) filter unit, comprising:

forming a first layer including a signal line for transmitting a signal and ground planes disposed apart from both sides of the signal line;

forming a via extending upward or downward from the signal line; and forming a second layer including at least one plate disposed opposite to each of the ground planes and an inductor line having a first end connected to the plate and a second end connected to the via.

16. The method of claim 15, wherein each of the first and second layers is formed using a complementary metal oxide semiconductor (CMOS) process, a multilayered printed circuit board (PCB) process, a low-temperature cofired ceramic (LTCC) process, or a high-temperature cofired ceramic (HTCC) process.

17. The method of claim 15, wherein the signal line, the via, the plate, and the inductor line are integrally formed using a metal with the same characteristics.

* * * * *